United States Patent
Song et al.

(10) Patent No.: US 7,558,979 B2
(45) Date of Patent: Jul. 7, 2009

(54) METHODS FOR DETERMINING SIMULTANEOUS SWITCHING INDUCED DATA OUTPUT TIMING SKEW

(75) Inventors: Ho-young Song, Gyeonggi (KR); Seong-jin Jang, Gyeonggi-do (KR); Kwang-il Park, Gyeonggi-do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 526 days.

(21) Appl. No.: 11/194,180

(22) Filed: Aug. 1, 2005

(65) Prior Publication Data
US 2006/0092717 A1 May 4, 2006

(30) Foreign Application Priority Data
Oct. 23, 2004 (KR) .................. 10-2004-0085088

(51) Int. Cl.
G06F 1/00 (2006.01)
G06F 11/00 (2006.01)
(52) U.S. Cl. ............... 713/500; 713/501; 713/503; 370/508
(58) Field of Classification Search .......... 713/500, 713/501, 503; 370/508
See application file for complete search history.

(56) References Cited

U.S. PATENT DOCUMENTS

| | | | | |
|---|---|---|---|---|
| 5,793,434 A * | 8/1998 | Lee | | 348/445 |
| 6,343,060 B1 | 1/2002 | Ko | | |
| 6,591,372 B1 * | 7/2003 | Nerl | | 713/503 |
| 6,611,905 B1 * | 8/2003 | Grundon et al. | | 711/167 |
| 6,807,377 B1 * | 10/2004 | Watanabe | | 398/154 |
| 6,922,731 B1 * | 7/2005 | Morioka et al. | | 709/231 |
| 7,137,090 B1 * | 11/2006 | Manaker et al. | | 716/6 |
| 2002/0021135 A1 * | 2/2002 | Li et al. | | 324/677 |
| 2005/0047192 A1 * | 3/2005 | Matsui et al. | | 365/145 |
| 2005/0154952 A1 * | 7/2005 | Kawada et al. | | 714/735 |

FOREIGN PATENT DOCUMENTS

| | | |
|---|---|---|
| JP | 2000-293259 | 10/2000 |
| KR | 10 2003 0009129 | 1/2003 |

* cited by examiner

*Primary Examiner*—Thomas Lee
*Assistant Examiner*—Michael J Brown
(74) *Attorney, Agent, or Firm*—Myers Bigel Sibley & Sajovec, PA

(57) ABSTRACT

A method of determining timing skew between data outputs of a memory device can include writing a predetermined data pattern to a memory device at a first operational frequency that is less than a normal operational frequency used to write non-predetermined data to the memory device. The memory device is read to output the predetermined data pattern therefrom at a second operational frequency that is greater than the first operational frequency and about equal to a normal operational frequency used to read non-predetermined data from the memory device. Timing skew is determined between outputs from the memory device based on the actual time when the predetermined data is provided from the memory device.

4 Claims, 1 Drawing Sheet

METHODS FOR DETERMINING SIMULTANEOUS SWITCHING INDUCED DATA OUTPUT TIMING SKEW

CROSS-REFERENCE TO RELATED APPLICATION

This application claims the priority of Korean Patent Application No. 10-2004-0085088, filed on Oct. 23, 2004, in the Korean Intellectual Property Office, the disclosure of which is incorporated herein in its entirety by reference.

FIELD OF THE INVENTION

The present invention relates to memory devices, and more particularly, to timing associated with memory devices.

BACKGROUND

In a system that includes an operational unit and a memory, the operational unit can simultaneously process a number of bits of data to perform an operation. Accordingly, data is typically supplied to the operation unit at a speed that supports the rate at which the operational unit processes data. Therefore, the operating speed of the system may depend on whether the memory is capable of supplying data to the operational unit when needed.

When the memory outputs data through, current is supplied to a switching device via a power line to the memory. When the switching device consumes the supplied current, switching noise may be generated due to a parasitic element associated the power line, thus causing a delay in data transmission or distortion of the data output from the memory.

It is assumed that most bits of data output from a semiconductor memory device are switched in one direction, and remaining bits of the data are switched in the other direction, e.g., in the opposite direction. In this case, the most significant bits of data and the remaining bits of the output data may be delayed for different times and the output of the data from the semiconductor memory device may occur at different times, thereby causing skew between the output data. The skew may become large when the number of data bits output from the semiconductor memory device is large, the magnitude of a parasitic element at the power line is large, and the data is output from the semiconductor memory device at high speed.

As appreciated by those skilled in the art, the skew represents inconsistencies (i.e., differences) in the timing between when data output from the memory device is available. When data is read from or written to a memory device, e.g., a dynamic random access memory (DRAM), data training may be performed to adjust for skew between data bits. Data training is a technique that adjusts for time skew between outputs of the memory device using a predetermined data pattern between a controller and the memory device. Data training may be categorized into two types: when data is written to the memory device and when data is read from the memory device.

In general, a memory device include an additional device to perform data training. However, inclusion of the additional device may reduce an area of the memory device in which memory cells are to be formed.

SUMMARY

Embodiments according to the invention can provide methods and computer program products for determining simultaneous switching induced data output timing skew. Pursuant to these embodiments, a method of determining timing skew between data outputs of a memory device can include writing a predetermined data pattern to a memory device at a first operational frequency that is less than a normal operational frequency used to write non-predetermined data to the memory device. The memory device is read to output the predetermined data pattern therefrom at a second operational frequency that is greater than the first operational frequency and about equal to a normal operational frequency used to read non-predetermined data from the memory device. Timing skew is determined between outputs from the memory device based on the actual time when the predetermined data is provided from the memory device.

In some embodiments according to the invention, the predetermined data pattern is selected to generate delay in reading the memory device due to switching of voltage levels at the outputs of the memory device. In some embodiments according to the invention, determining timing skew between outputs from the memory device includes setting a minimum delay time estimated to be when data would be output from the memory device without the delay due to switching, measuring an output time when the predetermined data becomes valid at the outputs, and determining the delay by subtracting the minimum delay time from the output time. In some embodiments according to the invention, determining timing skew between outputs includes determining the timing skew for each output of the memory.

In some embodiments according to the invention, a computer program product for determining timing skew between data outputs of a memory device can include a computer readable medium having computer readable program code embodied therein, the computer readable program product includes computer readable program code configured to write a predetermined data pattern to a memory device at a first operational frequency that is less than a normal operational frequency used to write non-predetermined data to the memory device. Computer readable program code is configured to read the memory device to output the predetermined data pattern therefrom at a second operational frequency that is greater than the first operational frequency and about equal to a normal operational frequency used to read non-predetermined data from the memory device. Computer readable program code is configured to determine timing skew between outputs from the memory device based on the actual time when the predetermined data is provided from the memory device.

In some further embodiments according to the invention, a method of determining timing skew between data outputs of a memory device includes determining timing skew between outputs from the memory device based on a difference between the actual time when predetermined data is provided from the memory device and a minimum delay time. In some embodiments according to the invention, the predetermined data is written to the memory device at a relatively slow speed in comparison to a speed at which the predetermined data is read from the memory device.

DESCRIPTION OF EMBODIMENTS ACCORDING TO THE INVENTION

Figure 1:
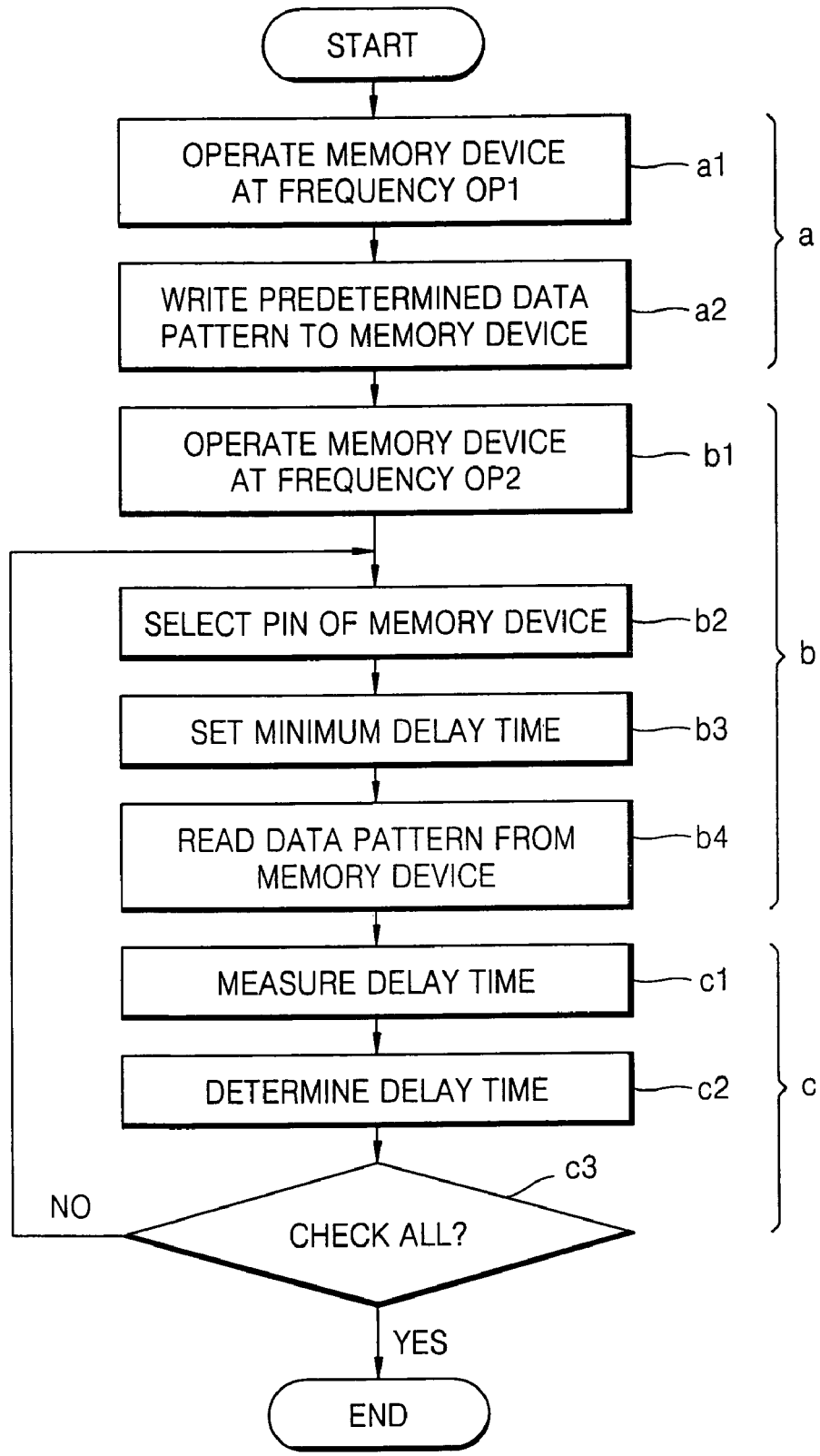
FIG. 1 is a flowchart illustrating methods of data training of memory devices according to some embodiments of the present invention.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. As used herein, the term "and/or" includes any and all combinations of one or more of the associated listed items. Like numbers refer to like elements throughout.

It will be understood that although the terms first and second are used herein to describe elements and should not be limited by these terms. These terms are only used to distinguish one element from another. Thus, a first element discussed below could be termed a second element, and a second element may be termed a first element without departing from the teachings of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise.

It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

As will be appreciated by one of skill in the art, the present invention may be embodied as circuits, methods, and/or computer program products. Accordingly, the present invention may take the form of an entirely hardware embodiment, an entirely software embodiment or an embodiment combining software and hardware aspects. Furthermore, the present invention may take the form of a computer program product on a computer-usable storage medium having computer-usable program code embodied in the medium. Any suitable computer readable medium may be utilized including flash memory, hard disks, CD-ROMs, optical storage devices, or magnetic storage devices.

The computer-usable or computer-readable medium may be, for example but not limited to, an electronic, magnetic, optical, electromagnetic, infrared, or semiconductor system, apparatus, device, or propagation medium. More specific examples (a non-exhaustive list) of the computer-readable medium would include the following: an electrical connection having one or more wires, a portable computer diskette, a random access memory (RAM), a read-only memory (ROM), an erasable programmable read-only memory (EPROM or Flash memory), an optical fiber, and a portable compact disc read-only memory (CD-ROM). Note that the computer-usable or computer-readable medium could even be paper or another suitable medium upon which the program is printed, as the program can be electronically captured, via, for instance, optical scanning of the paper or other medium, then compiled, interpreted, or otherwise processed in a suitable manner, if necessary, and then stored in a computer memory.

Computer program code or "code" for carrying out operations according to the present invention may be written in an object oriented programming language such as JAVA®, Smalltalk or C++, JavaScript, Visual Basic, TSQL, Perl, or in various other programming languages. Software embodiments of the present invention do not depend on implementation with a particular programming language. Portions of the code may execute entirely on one or more systems utilized by an intermediary server. The present invention is described below with reference to block diagram illustrations of circuits, methods, and computer program products according to embodiments of the invention. It is understood that each block of the illustrations, and combinations of blocks in the illustrations can be implemented by computer program instructions.

These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions specified in the block or blocks. These computer program instructions may be stored in a computer-readable memory that can direct a computer or other programmable data processing apparatus to function in a particular manner, such that the instructions stored in the computer-readable memory produce an article of manufacture including instruction means which implement the function specified in the block diagrams and/or flowchart block or blocks.

The computer program instructions may be loaded onto a computer or other programmable data processing apparatus to cause a series of operational steps to be performed on the computer or other programmable apparatus to produce a computer implemented process such that the instructions which execute on the computer or other programmable apparatus provide steps for implementing the functions specified in the block diagrams and/or flowchart block or blocks.

Referring to FIG. 1, in some embodiments according to the invention, a data training method according to an embodiment of the present invention includes (a) writing a predetermined data pattern to a memory device, (b) reading a data pattern from the memory device, and (c) determining a delay time in data transmission by measuring a delay time between the read data pattern and the predetermined data pattern. In other words, in some embodiments according to the invention, the delay time can be determined by monitoring the data output from the memory over time and noting when the data pattern is actually provided form the memory device.

In some embodiments according to the invention, the speed at which the predetermined data pattern is written to the memory device is slower than a normal operating speed of the memory device, and the speed at which the data pattern is read from the memory device is equivalent to the normal operating speed of the memory device.

More specifically, in some embodiments according to the invention, (a) writing the predetermined data pattern to the memory device can include (a1) operating the memory device at a frequency Op1 that is less than a normal operating frequency of the memory device, and (a2) writing the predetermined data pattern to a predetermined cell of the memory. Furthermore, in some embodiments according to the invention, (b) reading the data pattern from the memory device includes (b1) operating the memory device at a normal frequency Op2, and (b4) reading the data pattern from the memory device at the normal frequency Op2. Further, in some embodiments according to the invention, (b) reading the data pattern from the memory device may further include (b2) selecting a pin DQ of the memory device, which performs data training, and (b4) setting a minimum delay time in data transmission.

In some embodiments according to the invention, (c) determining a delay time in data transmission includes (c1) measuring the delay time between the read data pattern and the predetermined data pattern, (c2) determining the delay time using the measured delay time and the minimum delay time, and (c3) storing the determined delay time, and selecting another pin DQ of memory device when it is determined that all pins DQ of the memory device are not checked.

The data training method according to the present invention is preferably performed in a memory device that does not include an additional device for data training. According to the present invention, it is possible to write the predetermined data pattern to a memory cell since it is written at the frequency Op1 less than the normal operating frequency of the memory device as described with reference to FIG. 1. Also, when reading the data pattern from the memory device, the memory device operates at a normal operating frequency, and therefore, a delay time in data transmission can be determined.

As described above, a data training method according to the present invention may not require an additional timing skew circuit in a memory device, which may improve the degree of integration of a memory cell. Also, a delay time in data transmission can be determined for particular environments in which the memory device may operate.

Although the present invention has been described in connection with the embodiment of the present invention illustrated in the accompanying drawings, it is not limited thereto. It will be apparent to those skilled in the art that various substitution, modifications and changes may be thereto without departing from the scope and spirit of the invention.

What is claimed:

1. A data training method performed in a memory device which does not include an additional device for data training, the method comprising:
   (a) writing a predetermined data pattern to the memory device;
   (b) reading a data pattern from the memory device; and
   (c) determining a delay time in data transmission by measuring a delay time between the read data pattern and the predetermined data pattern,
   wherein a speed at which the predetermined data pattern is written to the memory device is less than a normal operating speed of the memory device, and
   wherein (b) the reading of the data pattern comprises:
   (b1) operating the memory device at the normal operating frequency; and
   (b2) reading the data pattern from the memory device at the normal operating frequency; and
   wherein (b) the reading of the data pattern further comprises (b3) selecting a pin of the memory device which performs the data training.

2. The data training method of claim 1, wherein (a) the writing of the predetermined data pattern comprises:
   (a1) operating the memory device at a frequency less than a normal operating frequency of the memory device; and
   (a2) writing the predetermined data pattern to a predetermined cell of the memory device.

3. The data training method of claim 1, wherein (b) the reading of the data pattern further comprises (b3) setting a minimum delay time in data transmission.

4. The data training method of claim 3, wherein (c) the determining of the delay time in data transmission comprises:
   (c1) measuring a delay time between the read data pattern and the predetermined data pattern;
   (c2) determining the delay time in data transmission using the measured delay time and the minimum delay time; and
   (c3) storing the determined delay time, and selecting another pin of the memory device when it is determined that all pins of the memory device are not checked.

* * * * *